(12) United States Patent
Langhammer et al.

(10) Patent No.: US 12,079,590 B2
(45) Date of Patent: Sep. 3, 2024

(54) EFFICIENT DUAL-PATH FLOATING-POINT ARITHMETIC OPERATORS

(71) Applicant: Intel Corporation, Santa Clara, CA (US)

(72) Inventors: Martin Langhammer, Alderbury (GB); Theo Drane, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 739 days.

(21) Appl. No.: 17/133,933

(22) Filed: Dec. 24, 2020

(65) Prior Publication Data

US 2022/0206747 A1 Jun. 30, 2022

(51) Int. Cl.
*G06F 7/485* (2006.01)
*G06F 5/01* (2006.01)
*H03K 19/20* (2006.01)

(52) U.S. Cl.
CPC .............. *G06F 7/485* (2013.01); *G06F 5/012* (2013.01); *H03K 19/20* (2013.01)

(58) Field of Classification Search
CPC .......... G06F 7/485; G06F 5/012; H03K 19/20
See application file for complete search history.

(56) References Cited

U.S. PATENT DOCUMENTS 8,463,835 B1 * 6/2013 Walke ..................... G06F 7/485
708/505

OTHER PUBLICATIONS

J.H. Min et al., A Low-Power Dual-Path Floating-Point Fused Add-Subtract Unit, Asilomar 2012, IEEE 2012 (Year: 2012).*
J. Sohn et al., Improved Architectures for a Floating-Point Fused Dot Product Unit, 2013 IEEE 21st Symposium on Computer Arithmetic, IEEE Computer Society, IEEE 2013 (Year: 2013).*

* cited by examiner

*Primary Examiner* — Emily E Larocque
(74) *Attorney, Agent, or Firm* — Fletcher Yoder, P.C.

(57) ABSTRACT

Systems and methods related to performing arithmetic operations on floating-point numbers. Floating-point arithmetic circuitry is configured to receive two floating-point numbers. The floating-point arithmetic circuitry includes a first path configured to perform a first operation on the two floating-point numbers based at least in part on a difference in size between the two floating-point numbers. The floating-point arithmetic circuitry includes a second path configured to perform a second operation on the two floating-point numbers based at least in part on the difference is size between the two floating-point numbers. The first path and the second path diverge from each other after receipt of the floating-point numbers in the floating-point arithmetic circuitry and converge on a shared adder that is used for the first operation and the second operation.

19 Claims, 12 Drawing Sheets

EFFICIENT DUAL-PATH FLOATING-POINT ARITHMETIC OPERATORS

FIELD OF THE DISCLOSURE

This disclosure relates to integrated circuits designed to perform floating-point arithmetic. More particularly, the present disclosure relates to producing efficient dual-path floating-point operators and/or efficient count-leading zeros circuits in floating-point operators.

Integrated circuit devices may utilize hardened circuitry-based floating-point operators to perform floating-point operation on floating-point numbers. As the numbers of floating-point operators expand within integrated circuit devices, the demand for efficiency in implementing the floating-point operators may increase. For example, previous integrated circuit devices may include tens to hundreds of floating-point operators while upcoming integrated circuit device designs may include thousands or tens of thousands of floating-point operators. Accordingly, a level of efficiency that was suitable in previous integrated circuit devices may be less suitable in upcoming devices due to the increased numbers of floating-point operators.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, these statements are to be read in this light, and not as admissions of prior art.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. To provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "some embodiments," "embodiments," "one embodiment," or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

As discussed in further detail below, embodiments of the present disclosure relate generally to logic circuitry having floating-point operators. As the numbers of floating-point operators expand within integrated circuit (IC) devices, the resources consumed by the floating-point operators may increase the demand for efficiency in implementing the floating-point operators. For example, previous IC devices may include tens to hundreds of floating-point operators while upcoming IC device designs may include thousands or tens of thousands of floating-point operators. One mechanism for improving such efficiency may include using design tools used to synthesize a circuit that may include multiple (e.g., 10,000) floating-point arithmetic logic units (ALUs) that include a far path for cases where the exponents of numbers operated on are far apart and a near path for cases where the exponents of numbers are near to each other. The ALUs may use a rounding method that is applied to a far path adder that separates an adder/subtractor from a rounding operation. The far path adder/subtractor can also be used as the near path subtractor enabling reuse of circuitry between both paths. Furthermore, the near path may include a synthesized circuit that combines a count leading zeros function with a shift (e.g., a left shift) to create a simpler, faster, and smaller circuit.

Figure 1:
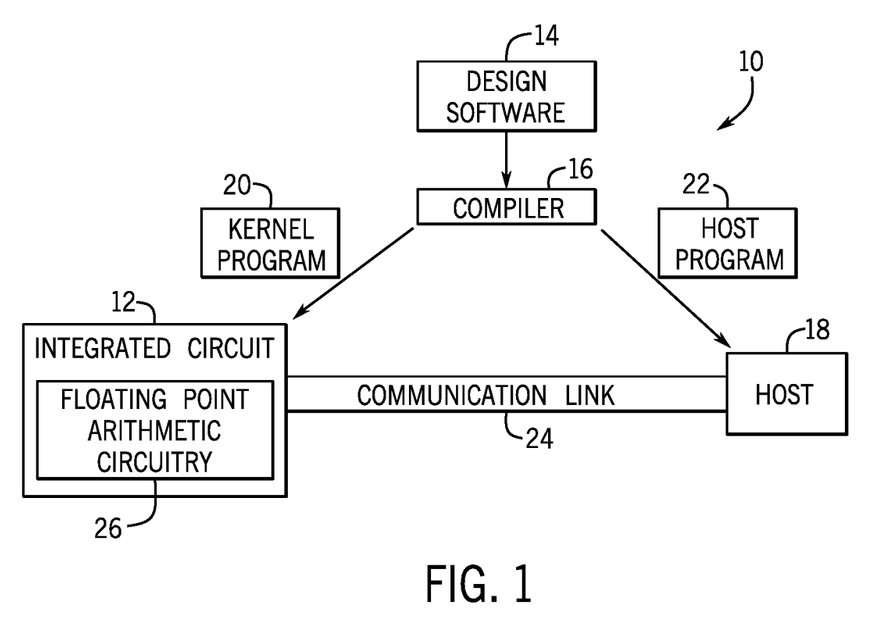
FIG. 1 is a block diagram of a system for implementing floating-point addition, in accordance with an embodiment of the disclosure.

With the foregoing in mind, FIG. 1 illustrates a block diagram of a system 10 that may implement efficient mantissa rounding techniques. A designer may desire to implement functionality involving floating-point number operations on an integrated circuit device 12 (IC, such as a field programmable gate array (FPGA)). The designer may specify a high-level program to be implemented, such as an OpenCL program, which may enable the designer to more efficiently and easily provide programming instructions to configure a set of programmable logic cells for the integrated circuit device 12 without requiring specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that are required to learn unfamiliar low-level hardware description languages to implement new functionalities in the IC.

Designers may implement their high-level designs using design software 14, such as a version of Intel® Quartus® by INTEL CORPORATION. The design software 14 may use a compiler 16 to convert the high-level program into a lower-level description. The design software 14 may also be used to optimize and/or increase efficiency in the design. The compiler 16 may provide machine-readable instructions representative of the high-level program to a host 18 and the integrated circuit device 12. The host 18 may receive a host program 22, which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of a floating-point arithmetic circuitry 26 on the integrated circuit device 12. The floating-point arithmetic circuitry 26 may include circuitry and/or other logic elements and may be configured to implement, for example, floating-point arithmetic logic in hardened circuits configured to perform floating-point multiplication, floating-point addition, rounding, and the like.

Figure 2:
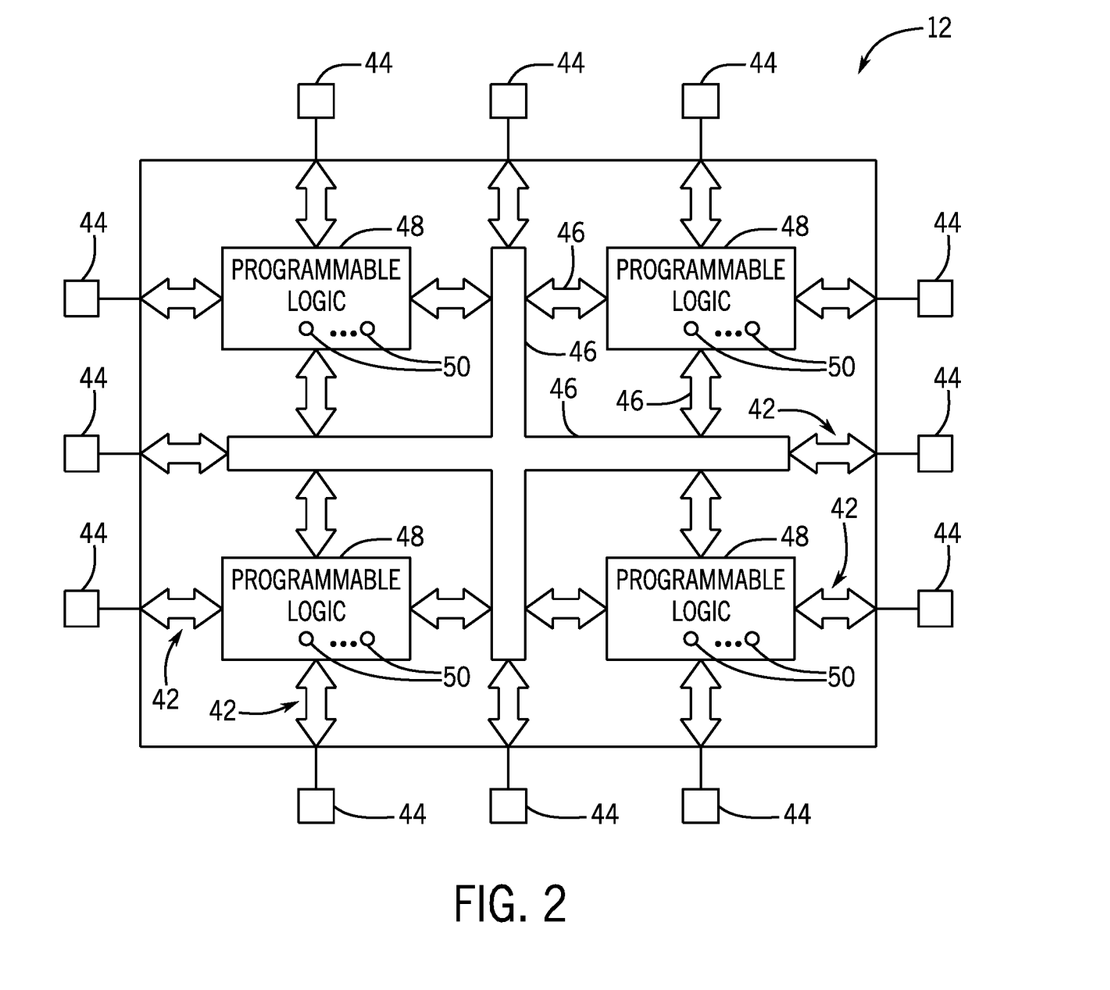
FIG. 2 is a block diagram of an integrated circuit where floating-point adders may be implemented, in accordance with an embodiment of the disclosure.

Turning now to a more detailed discussion of the integrated circuit device 12, FIG. 2 illustrates an integrated circuit device 12, which may be a programmable logic device, such as a field programmable gate array (FPGA). Further, it should be understood that the integrated circuit device 12 may be any other suitable type of programmable logic device (e.g., an application-specific integrated circuit and/or application-specific standard product). As shown, integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48. The programmable logic may include multiple various types of programmable logic 48 of different tiers of programmability. For example, the programmable logic 48 may include various mathematical logic units, such as arithmetic logic units (ALUs), each configured to perform various mathematical functions (e.g., floating-point arithmetic calculations).

As previously discussed, the programmable logic may include a relatively large number (e.g., hundreds, thousands, tens of thousands, etc.) of ALUs, such as floating-point ALUs (FP ALUs). The FP ALUs may be implemented using different techniques with different levels of efficiency. By using synthesis methods disclosed herein, FP adders may be implemented in a physically smaller space with lower latency. Specifically, the FP adders disclosed herein may utilize separate near and far paths that diverge and then converge to share some circuitry before again diverging. Additionally or alternatively, a synthesis approach may be used to clear leading zeroes and shifting into a combined shifting leading zeros circuit.

Figure 3:
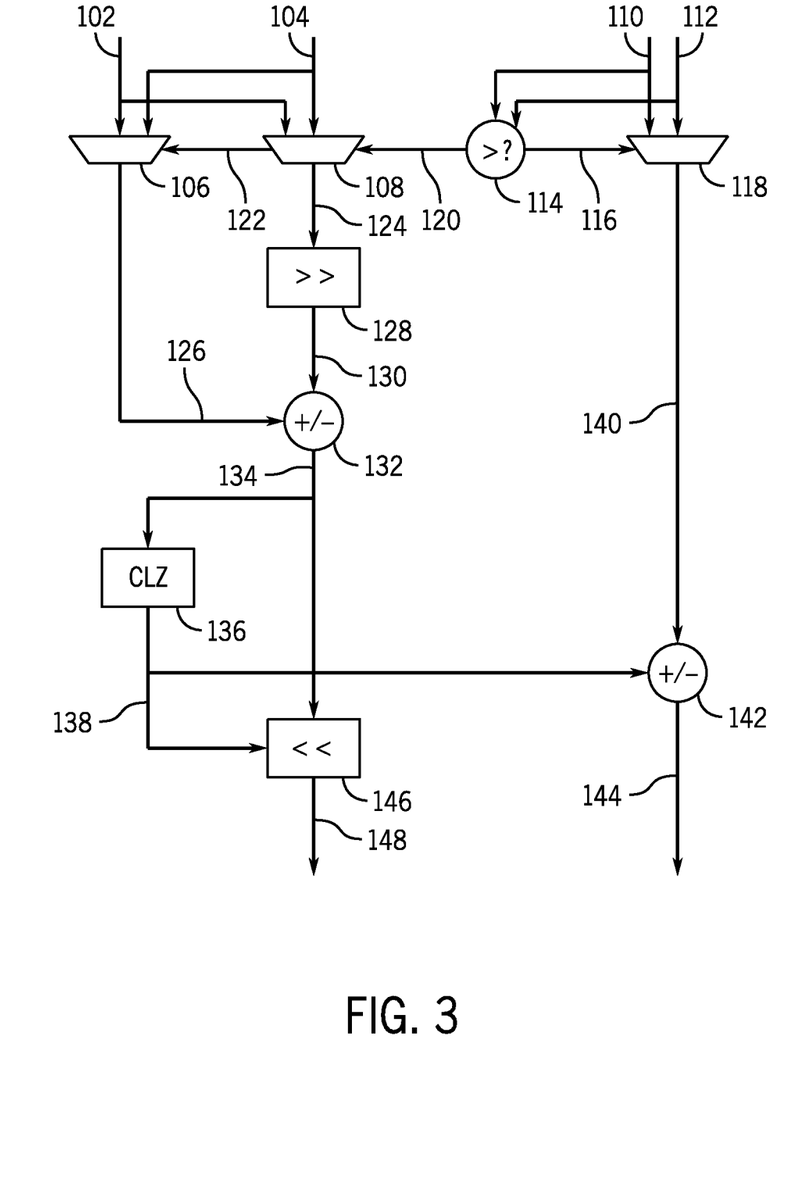
FIG. 3 is a block diagram of a single path floating-point adder that may be implemented in the integrated circuit, in accordance with an embodiment of the disclosure.

With this is mind, FIG. 3 is a simplified block diagram of an embodiment of an FP adder 100. The FP adder 100 receives two or more floating-point numbers and combines (e.g., adds or subtracts) the floating-point numbers to achieve a result. Each floating-point number includes a sign, an exponent, and a mantissa. For example, in FP32 numbers, the FP32 number includes a single sign bit, an eight-bit exponent, and a twenty-three-bit mantissa. In the FP adder 100, these separate components of the floating-point numbers are received in the FP adder 100. For instance, the FP adder 100 receives mantissas 102 and 104 at multiplexers 106 and 108.

The multiplexers 106 are 108 are controlled based on results of a comparison between the exponents 110 and 112 in a comparator 114. Since the two floating-point numbers are received as normalized floating-point numbers with a leading one, one of the numbers (e.g., the smaller number) may be denormalized to align the two floating-point numbers to the same exponent. Thus, the comparator 114 selects the number with the higher exponent and sends a corresponding control signal 116 to a multiplexer 118. The comparator 114 also sends control signals 120 and 122 to the multiplexers 106 and 108. Using these control signals 120 and 122, the multiplexers 106 and 108 enable the FP adder 100 to ensure that a mantissa 124 corresponding to the smaller number (e.g., smaller exponent) is transmitted from the multiplexer 108 and that a mantissa 126 corresponding to a larger number is transmitted from the multiplexer 106. Accordingly, the exponent of the larger number may be selected as the base exponent. Since the smaller number may need to be aligned to the exponent of the larger number, the mantissa 124 may be right shifted in a shifter 128 by a number of places corresponding to a difference in the respective exponents. A shifted mantissa 130 is output from the shifter 128. The shifted mantissa 130 and the mantissa 126 are transmitted to an adder/subtractor 132 that may add or subtract the values based on the signs of the input floating-point numbers and a selected operation (e.g., adding or subtracting) for the FP adder 100. After adding or subtracting, a result 134 may be denormalized. Accordingly, count leading zeros circuitry (CLZ) 136 may be used to count a number of zeros in front of the first one to output a control 138 indicating how far the result 134 is to be shifted to normalization in an implied leading 1 format (e.g., IEEE754 FP). In such shifting, the FP adder 100 adds or subtracts from a base exponent 140 (e.g., exponent of the larger number) using an adder/subtractor 142 to generate an output exponent 144. The number added or subtracted in the adder/subtractor 142 also indicates how many shifts are to be applied by a shifter 146 to the result 134 to generate a normalized result 148.

As previously noted, FIG. 3 illustrates a simplified block diagram of an embodiment of the FP adder 100. Indeed, additional circuitry may be included in the FP adder 100 that may be omitted from FIG. 3 for simplicity. For instance, the FP adder 100 may utilize exception handling on inputs and/or outputs. The FP adder 100 may also utilize internal functions, such as rounding of the sum or difference in the adder/subtractor 132. Rounding may be complex and may impact the actual implementation of the FP adder 100 significantly.

The FP adder 100 may be implemented using a dual-path implementation that may perform faster and more efficiently than the FP adder 100. Specifically, a critical path for the FP adder 100 may include the shifter 128, the adder/subtractor 132, the CLZ 136, and shifter 146. The shifter 128 may be roughly the same size and speed as the adder/subtractor 132, and a combination of the CLZ 136 and the shifter 146.

In floating-point addition/subtraction, there are two common cases: a near case and a far case. In the near case, the two input numbers are almost the same in that the exponents 110 and 112 are equal to each other or differ by a number at or below a threshold (e.g., one). Hence, the shifter 128 may shift in a direction (e.g., right) by a maximum of the threshold number (e.g., one) of bits. If these near numbers are subtracted, there is a chance that the result will be very small, meaning that a large shift may be used. For example, if 1.4999 is subtracted from 1.5, the result of 0.0001 has multiple shifts to the right for normalization.

In the far case, the exponents 110 and 112 differ by more than the threshold number. For example, the exponents 110 and 112 may differ by two or more. Here, the right shift in the shifter 128 may be large, but the result of the subtraction is close to the normalized range using less shifts in the normalization. For instance, a normalization shift (e.g., left shift) may be limited to one bit or less.

In both the far and near cases, an addition will result in a maximum of a 1-bit right shift for the normalization. Using these characteristics, the FP adder may be split into a near path for near case subtractions and a far path for far case additions and subtractions. The far path may also be used to service near case additions since both near and far case additions utilize a small post-addition shifter.

Figure 4:
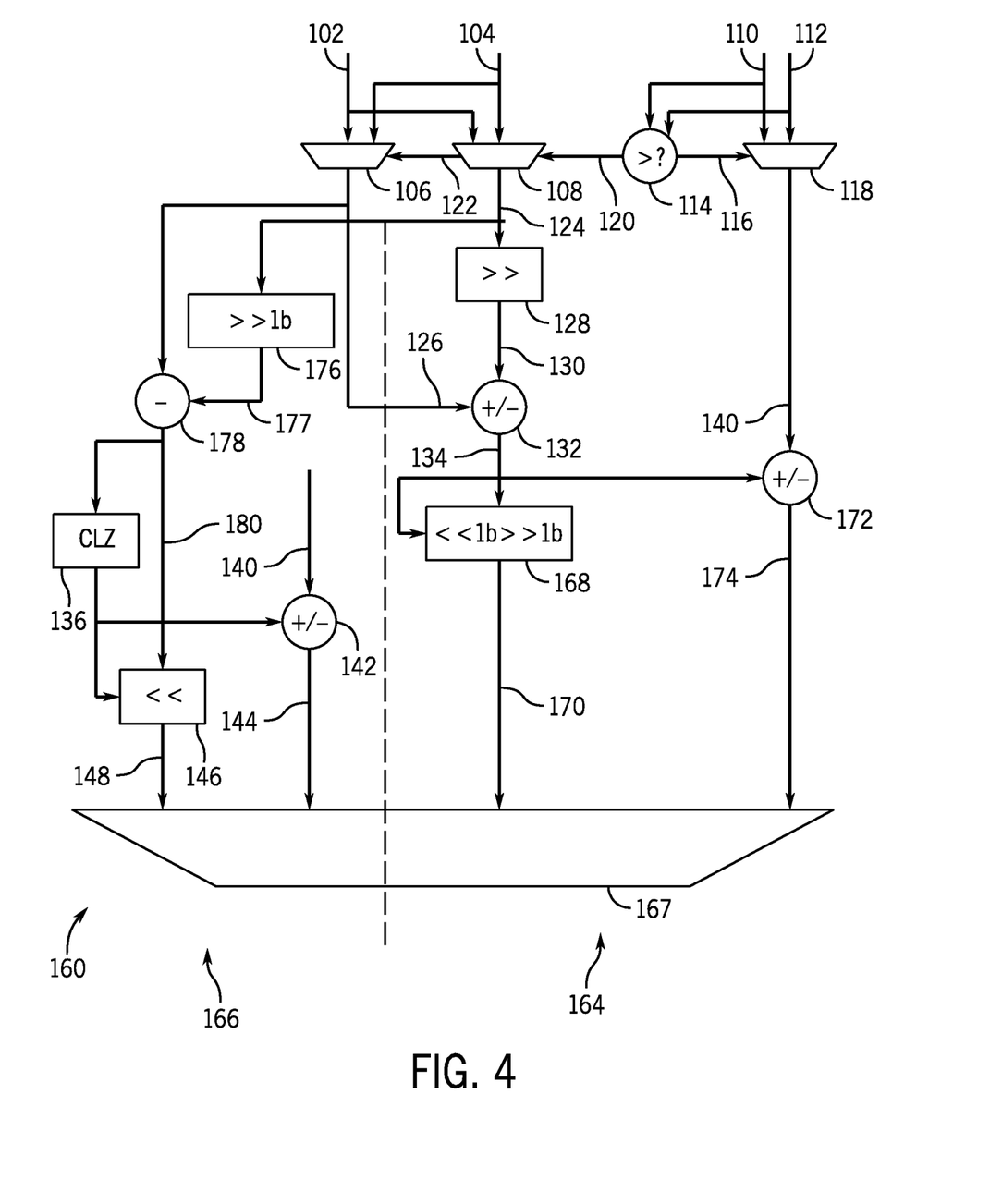
FIG. 4 is a block diagram of dual-path floating-point adder using a dedicated subtractor for one path that may be implemented in the integrated circuit, in accordance with an embodiment of the disclosure.

FIG. 4 illustrates a simplified block diagram of an embodiment of an FP adder 160 including a far path 164 and a near path 166. Both the far path 164 and the near path 166 receive the mantissas 124, 126 and generate respective outputs that are transmitted to an output multiplexer 167 that is configured to select between the near path output and the far path output as an output for the FP adder 160. As illustrated, the mantissas 124, 126 are generated as previously discussed related to the FP adder 100 of FIG. 3. Similarly, the shifter 128 and the adder/subtractor 132 both function as previously discussed in relation to the FP adder 100 of FIG. 3 except that the shifter 128 and the adder/subtractor 132 are in the far path 164 of the FP adder 160. However, the result 134 from the adder/subtractor 132 are transmitted to a single-bit shifter 168 that shifts right or left to generate a far path output 170 that is transmitted to the output multiplexer 167. The size (e.g., 0 or 1) and direction of the shift in the single-bit shifter 168 is transmitted to an adder/subtractor 172 to generate the far exponent 174 from the base exponent 140. When the far path output 170 is selected by the output multiplexer 167, the far exponent is used with the far path output 170 to form the floating-point output.

The near path 166 receives the mantissa 124 at a shifter 176 that shifts the mantissa 124 by the threshold number (e.g., 1 bit) or less to align the mantissa 124 to the larger number as a shifted mantissa 177. The shifted mantissa 177 is subtracted from the mantissa 126 in a subtractor 178 to generate an output 180. The output 180 is transmitted to the CLZ 136 and the shifter 146 to generate the normalized result 148 and the output exponent 144. The CLZ 136 and the shifter 146 function as described in related to the FP adder 100 of FIG. 3. The output multiplexer 167 selects the normalized result 148 and the output exponent 144 for near case subtractions.

Both the near path 166 and the far path 164 will utilize an additional shifter (e.g., single-bit shifter 168 and shifter 176) in the FP adder 160 in comparison to the FP adder 100. However, these shifters may have a small area and latency compared to full precision shifters (e.g., shifters 128 and 146). Accordingly, the critical path reduces to a large shifter (e.g., shifters 128 and 146), an adder, and a smaller shifter. In the near path 166, the adder is only used as a subtractor 178 that does not utilize rounding. Accordingly, the subtractor 178 is smaller than the adder/subtractor 132 in the far path 164. Although the size of the individual components of the FP adder 160 may be larger than the FP adder 100, in the real world where timing closure is to be achieved, the FP adder 160 may be smaller due to the ease with which the two separate paths may be synthesized to speed.

Figure 5:
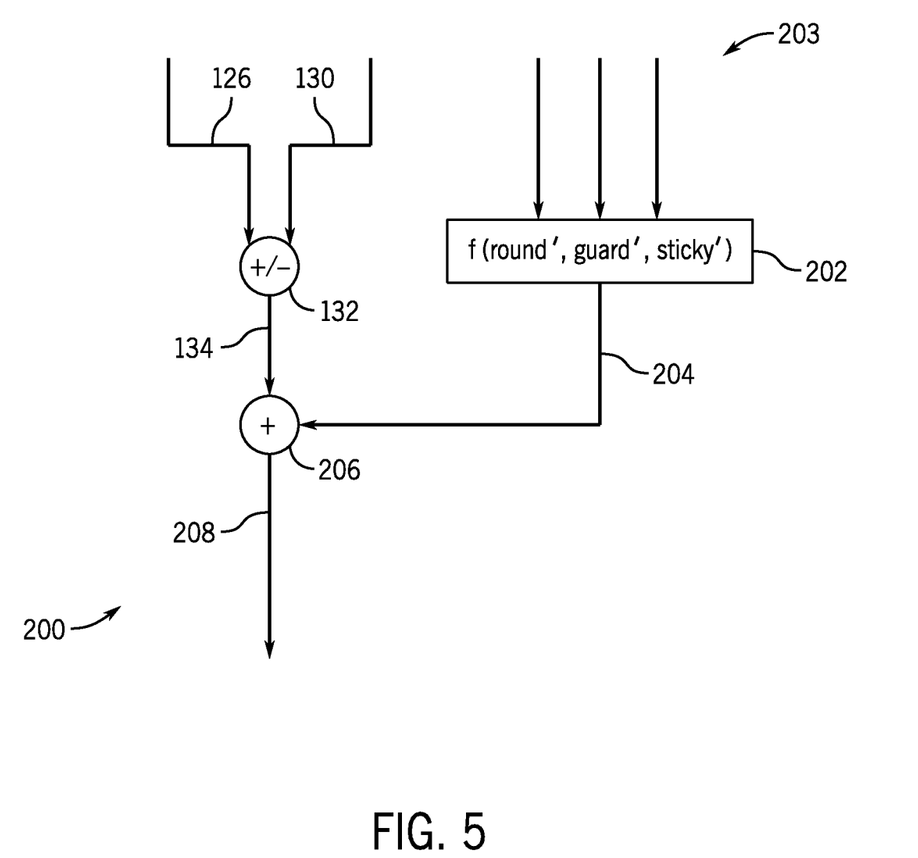
FIG. 5 is a block diagram of adding and rounding circuitry that may be implemented in the floating-point adder of FIG. 3 or 4, in accordance with an embodiment of the disclosure.

As previously noted, the subtractor 178 may not utilize rounding due to the nature of subtraction. However, the adder/subtractor 132 in the far path 164 may utilize rounding to accommodate rounding after addition. FIG. 5 is a simplified block diagram of adding and rounding circuitry 200. The adding and rounding circuitry 200 includes the adder/subtractor 132 that receives the mantissa 126 and the shifted mantissa 130 to generate the result 134. The adding and rounding circuitry 200 also includes processing circuitry 202 that receives one or more inputs 203 to calculate/generate a rounding value 204 that controls how the result 134 is rounded. The inputs 203 may be received from the shifter 128, the single-bit shifter 168, and/or other locations in the integrated circuit device 12 selecting whether to round and where to apply rounding. The rounding value 204 is added to the result 134 in an adder 206 that generates a rounded result 208 that is transmitted to the single-bit shifter 168 as the result 134.

Figure 6:
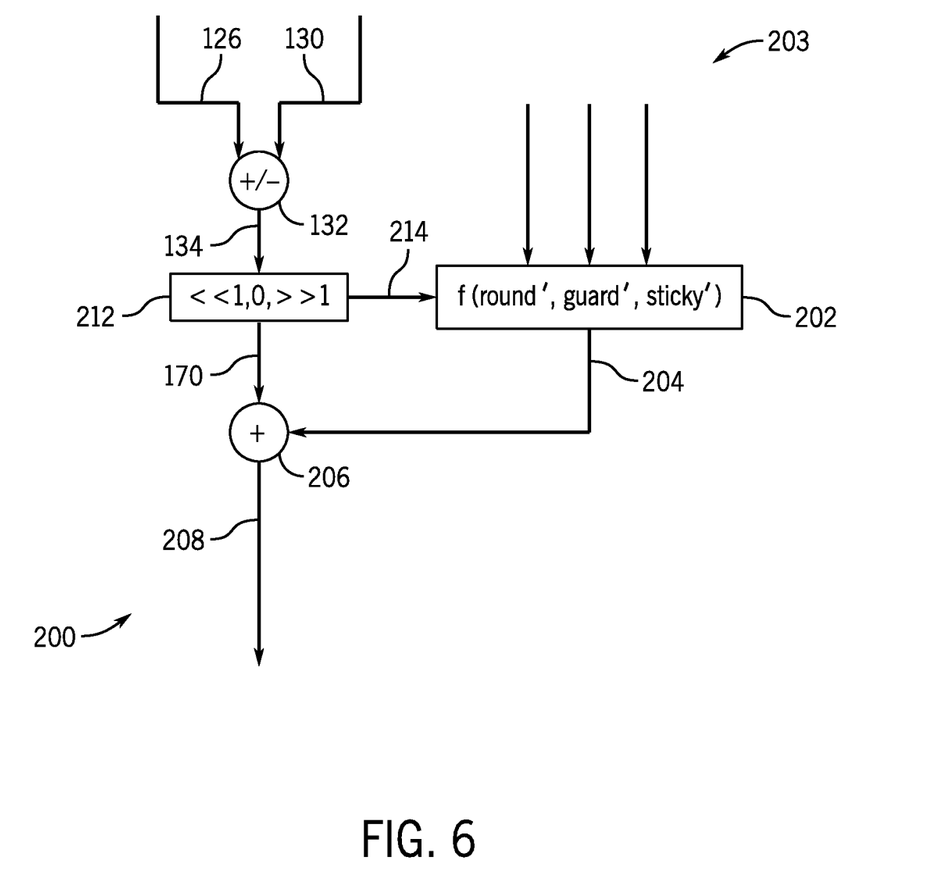
FIG. 6 is a block diagram of adding and rounding circuitry with a single-bit shifter that may be implemented in the floating-point adder of FIG. 3 or 4, in accordance with an embodiment of the disclosure.

In actual implementations, chaining multiple carry propagate adders (e.g., the adder/subtractor 132 and the adder 206) together may be expensive in terms of area and latency. As illustrated in FIG. 6, in an adding and rounding circuitry 210, this cost may be further complicated by a round point implemented as left or right shift in a shifter 212 between the adder/subtractor 132 and the adder 206. This addition and rounding circuitry 210 may be combined into a single compound adder that combines the adder/subtractor 132, the round point selection in the shifter 212, the rounding value calculation in the processing circuitry 202, and the adder 206 into a single level of logic.

Figure 7:
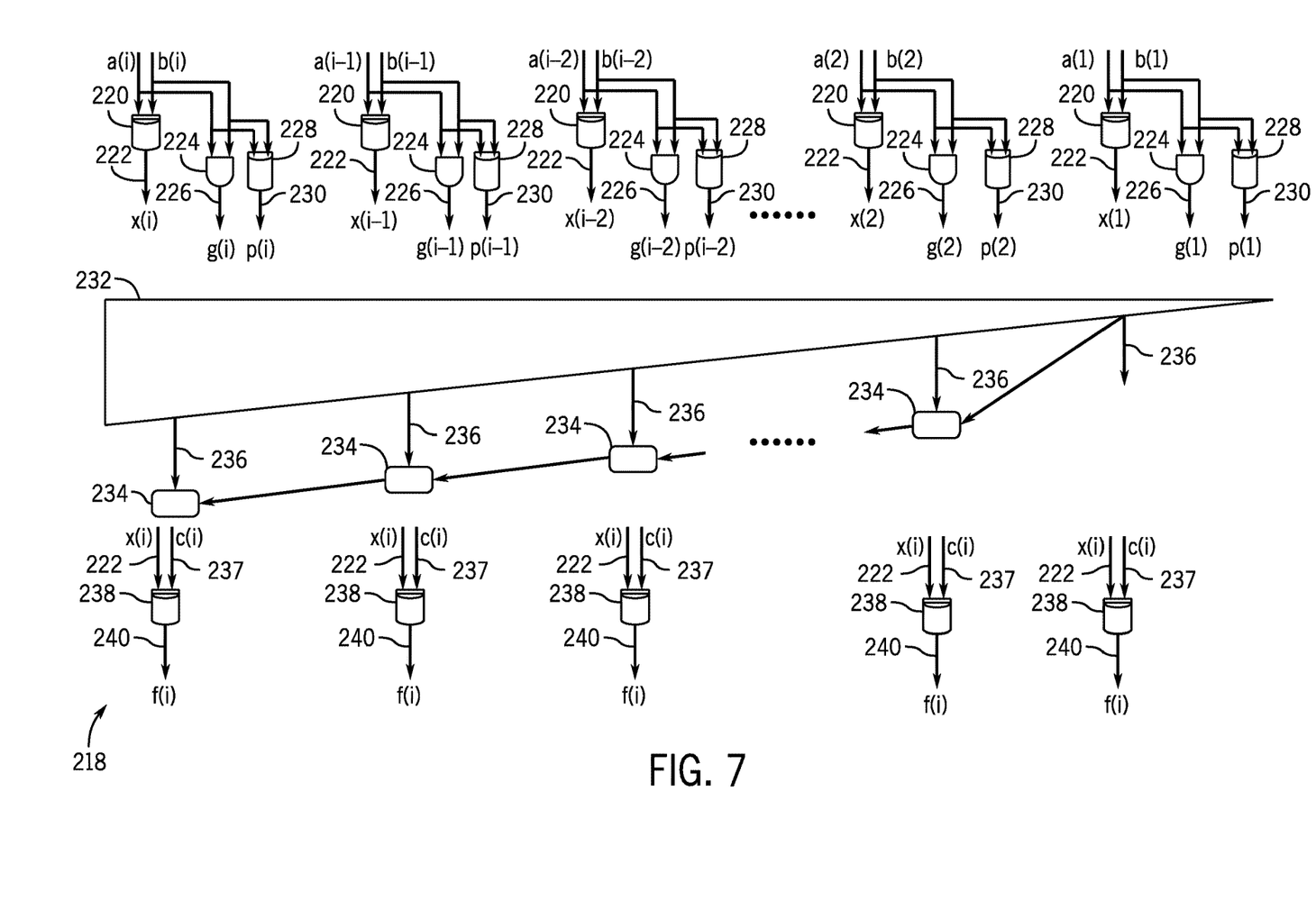
FIG. 7 is a block diagram of a compound adder that adds and rounds input values, in accordance with an embodiment of the disclosure.

FIG. 7 is a simplified block diagram of an embodiment of a compound adder 218. In the compound adder 218, input operands (e.g., bits of the mantissas 126 and 130) are transmitted to respective XOR gates 220 to calculate intermediate signals 222. The input operands are also transmitted to respective AND gates 224 to calculate respective generate signals 226. The input operands are also transmitted to respective OR gates 228 to calculate propagate signals 230. The generate signals 226 and the propagate signals 230 are transmitted to a parallel prefix circuit 232 that uses the generate signals 226 and the propagate signals 230 to calculate respective carry signals 236. The calculation of the carry signals may be performed using rounding circuitry nodes 234. In some embodiments, a prefix tree of the parallel prefix circuit 232 may include topologies such as a Brent-Kung network or a Kogge-Stone network. In some embodiments, an additional layer may follow the prefix network to implement a structure known as a flagged prefix adder. In other words, the rounding circuitry nodes 234 add some number of layers to the multiple layers of the parallel prefix circuit 232 to produce calculated carry signals 237. The calculated carry signals 237 and the respective intermediate signals 222 are transmitted to respective XOR gates 238 to generate output signals 240.

The combination of the foregoing circuitries may resolve in a complex network. As discussed below, overlapping portions of the near path 166 and the far path 164 may be combined to simplify such networks with increased efficiency and/or lower latency.

Figure 8:
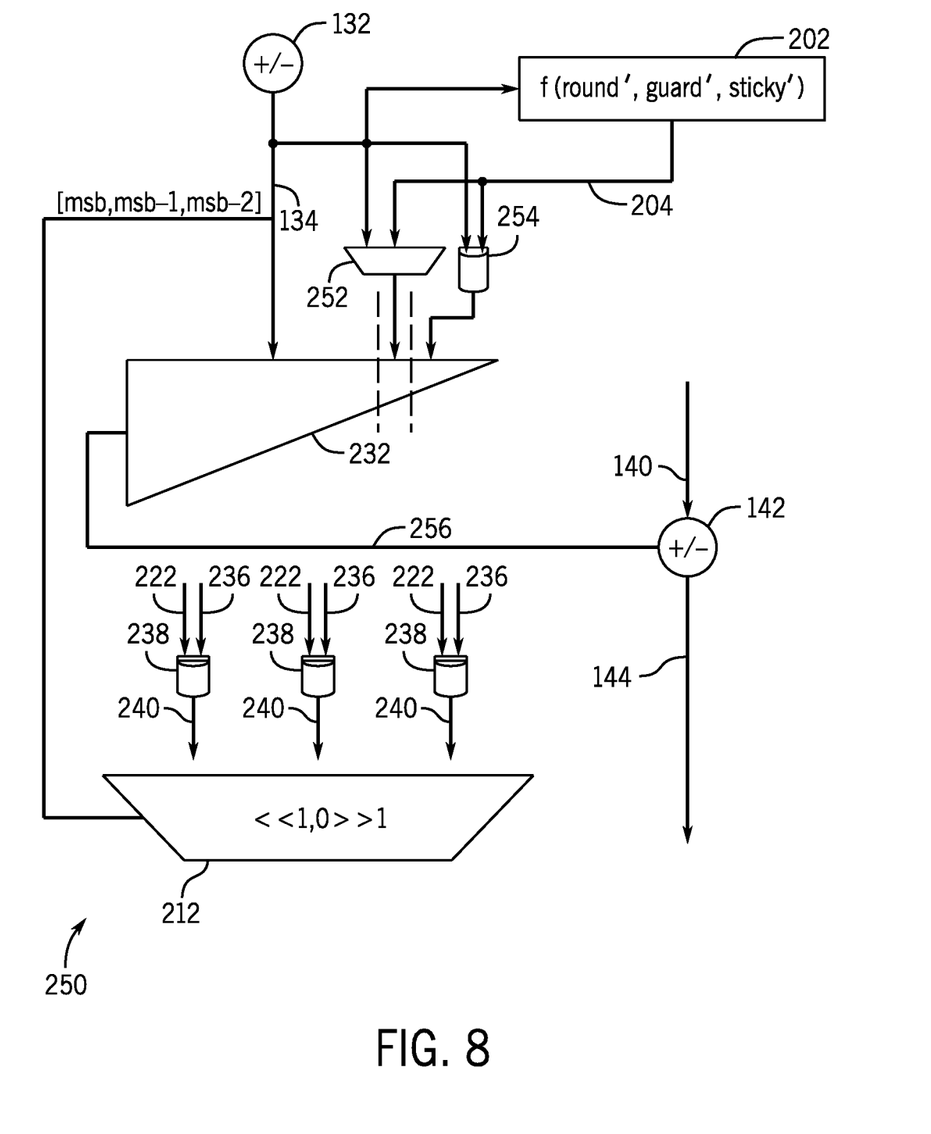
FIG. 8 is a block diagram of an adder and rounding circuitry that efficiently implements adding and rounding, in accordance with an embodiment of the disclosure.

FIG. 8 shows an alternate embodiment for implanting the rounding functionality in adding and rounding circuitry 250. The adding and rounding circuitry 250 includes the adder/subtractor 132, the processing circuitry 202, the parallel prefix circuit 232, and the XOR gates 238. However, rather than shifting the output of the parallel prefix circuit 232, a multiplexer 252 may be used to mux a rounding bit (e.g., rounding value 204) with the result 134 above one or more least significant bits of the parallel prefix circuit 232 that have propagate bits forced high using one or more OR gates 254 that ORs the result 134 with the rounding value 204. The propagate bits that are forced high correspond to bits rounded out of the result 134.

The adding and rounding circuitry 250 is relatively inexpensive as the rounding is only to be performed for a certain number (e.g., 3) of the least significant bits of the parallel prefix circuit 232. If a bit propagates out of the parallel prefix circuit 232, an overflow 256 from the round has occurred and the base exponent is adjusted by one. Accordingly, the shifter 212 may be located after the XOR gates 238 if needed without a loss of performance or increase in area. Additional details regarding multiplexer and OR gate-based rounding using a parallel prefix circuit 232 may be found in U.S. patent application Ser. No. 17/133,861, titled "Rounding Circuitry for Floating-Point Mantissas", filed on Dec. 24, 2020 that is incorporated in its entirety for all purposes.

As previously noted, rounding shifting in the shifter 212 may be performed in the far path 164 at the end of and/or after adding in the adding and rounding circuitry 250. This allows building of an FP adder 270 illustrated in FIG. 9 where a far path 272 and a near path 274 have separate portions but share the adder/subtractor 132 for the cost of a single 2:1 multiplexer 276. Since rounding circuitry 277 may be implemented in a portion where the far path 272 is separate from the near path 274 and separate from the adder/subtractor 132, the adder/subtractor 132 may be shared between the far path 272 and the near path 274 since the simple adder function may be accessed directly without using all of the compound adder 218. This separation of the adder/subtractor 132 from the rounding circuitry 277 may be implemented without an increase of area or latency over the compound adder 218. The only increase includes the single 2:1 multiplexer 276. However, the increase due to the single 2:1 multiplexer 276 may still save area by omitting the separate subtractor 178 used in the near path 166.

Figure 9:
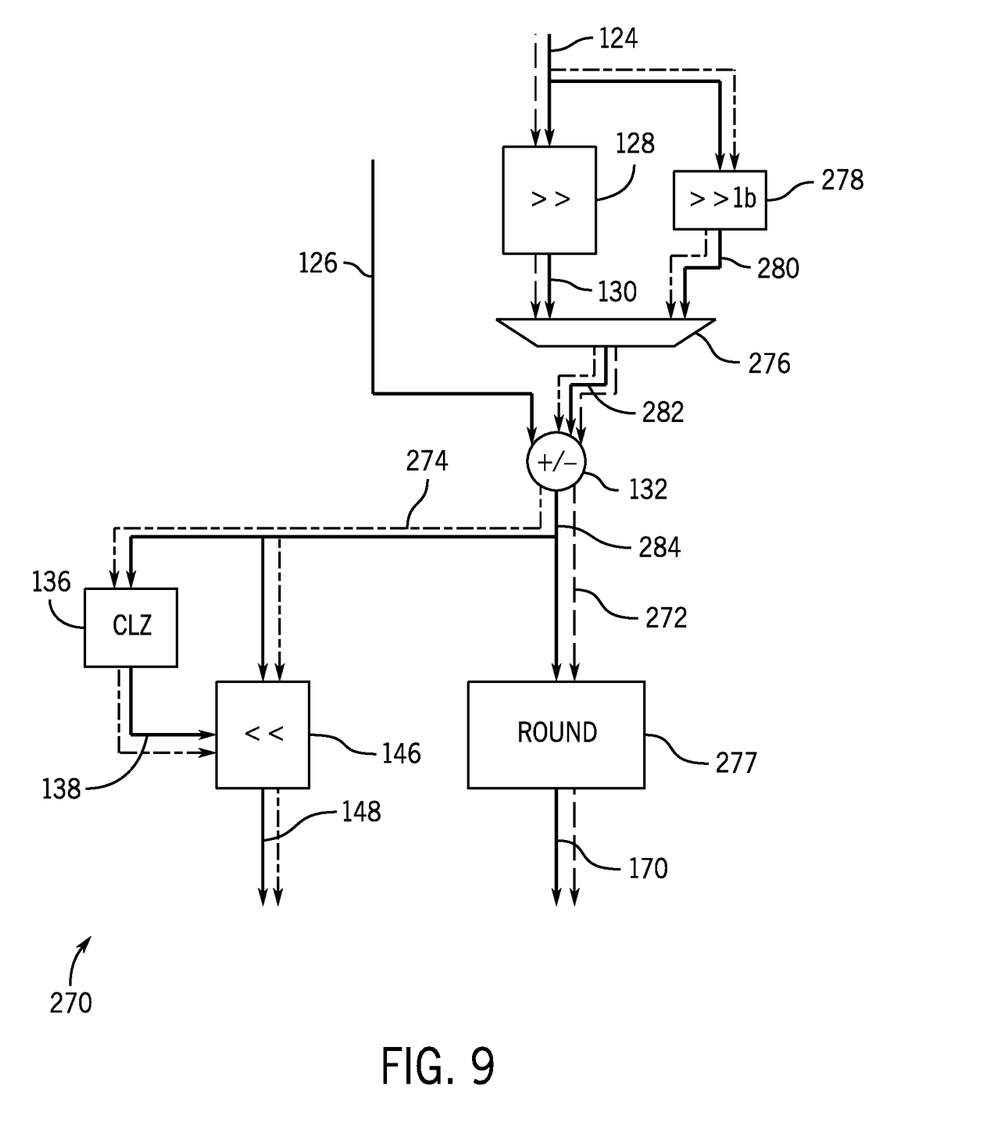
FIG. 9 is a block diagram of a dual-path adder that converges the dual paths to use a same adder/subtractor for both paths without including a dedicated adder or subtractor for either path, in accordance with an embodiment of the disclosure.

The FP adder 270 derives the mantissa 126 and the mantissa 124 using the same techniques used in relation to the FP adders 100 and 160. When two near case floating-point numbers are received, in the near path 272, the mantissa 124 corresponding to the smaller number may be shifted in a shifter 278. The shifter 278 shifts the mantissa 124 by the threshold number (e.g., 1 bit) or less to normalize the mantissa 124 to the larger number as a shifted mantissa 280. For instance, when the near case includes the mantissas 124 and 126 corresponding to the same exponents, the shifted mantissa 280 may be unshifted from the mantissa 124. The shifted mantissa 280 is transmitted to the single 2:1 multiplexer 276 along with the shifted mantissa 130 for the far path 274. The single 2:1 multiplexer 276 selects between the shifted mantissa 130 and the shifted mantissa 280 as a selected mantissa 282. The selected mantissa 282 is added to or subtracted from the mantissa 126 in the adder/subtractor 132 regardless of whether the incoming data is a near case or far case.

In the near case, a result 284 from the adder/subtractor 132 is transmitted to the CLZ 136, and the near path 274 includes processing of the result 284 to generate the normalized result 148 similar to how the FP adder 100 generates the normalized result 148 from the result 134. As may be appreciated, the CLZ 136 and the shifter 146 may a pedantic implementation. A real-world implementation may have much more complex designs to optimize delay by breaking up this calculation. For example, the CLZ 136 may consist of two parts, a leading zero anticipator (that makes a fairly accurate guess to the shift based on the two inputs to the adder/subtractor 132) followed by a fine adjustment where the CLZ 136 is fine tuned. This enables the complex calculation part of the CLZ 136 to run in parallel with the adder while the fine adjustment is much smaller (and faster) than the other part of the CLZ 136.

In far cases that utilize rounding, the result 284 is sent to the rounding circuitry 277 for rounding and/or normalization to generate the far path output 170. If rounding is not utilized, the far path output 170 is the same as the result 284 with or without normalization in the rounding circuitry 277.

Figure 10:
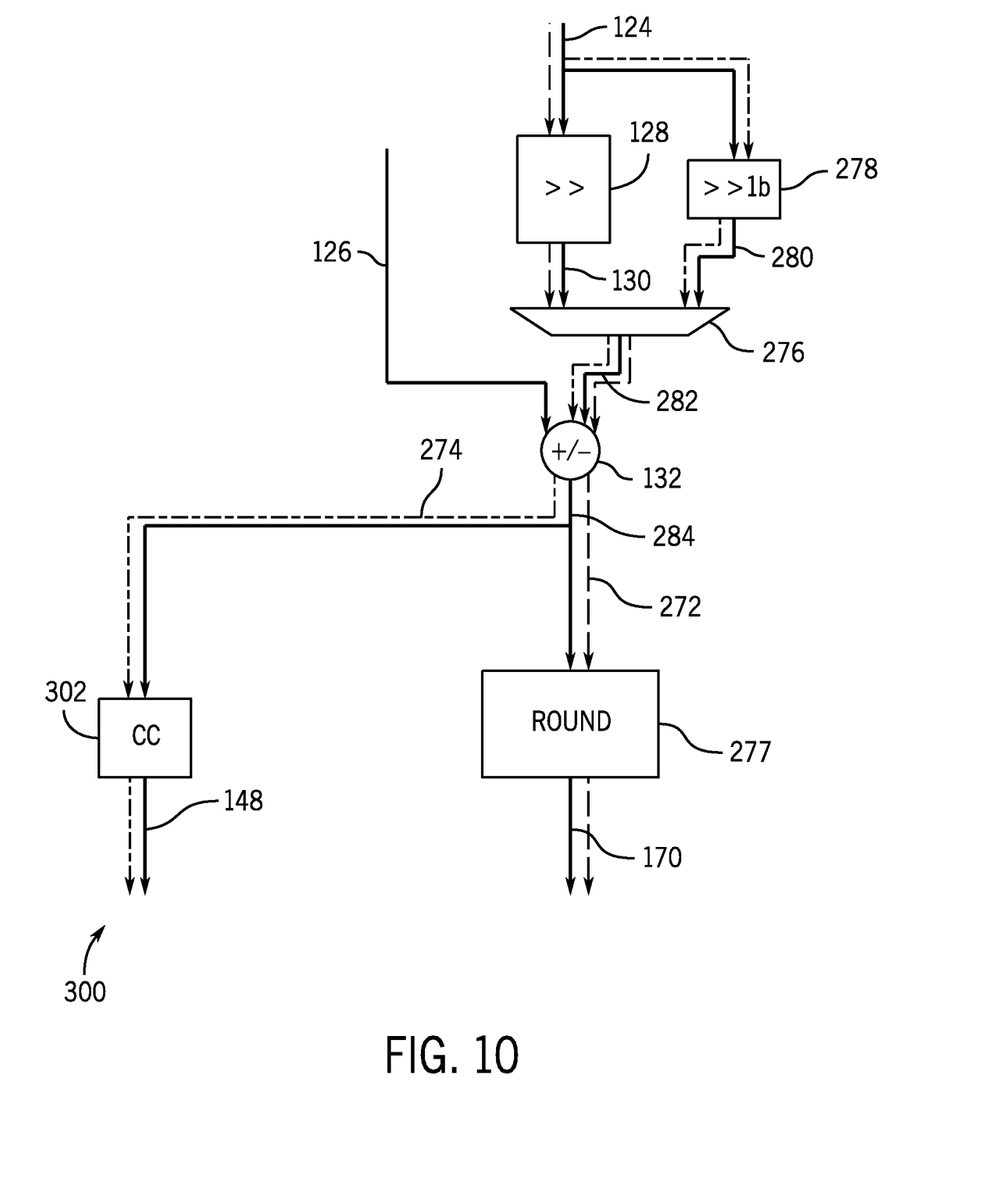
FIG. 10 is a block diagram of the dual-path adder of FIG. 9 with a combined circuit replacing a count leading zeros circuit and normalization shifter in the dual-path adder of FIG. 9, in accordance with an embodiment of the disclosure.

As illustrated, the normalization shift for the near path 274 using the shifter 146 is more complex than the denormalization shift for the far path 272 in the shifter 128. This is true because the CLZ 136 is used to determine the normalization shift amount. Any suitable CLZ 136 implementation may be used in the FP adder 270. However, in some embodiments, the CLZ 136 and the shifter 146 may be combined into a single logical unit. For instance, FIG. 10 illustrates a FP adder 300 that is identical to the FP adder 260 except that a combined circuit 302 may be used to replace the CLZ 136 and the shifter 146 to generate the normalized result 148. Instead of using separate CLZ 136 and the shifter 146 separately, the normalized result 148 may be determined by examining the results of both circuits holistically. For instance, the operation of the CLZ 136 and the shifter 146 may be described as an IF-THEN-ELSE chain. If the CLZ 136 determines that a first bit has a 1, no shift is to occur, and shift determinations are not made at subsequent bit locations. If the CLZ 136 determines that a second bit has a 1 following a 0 in the first bit, a single left shift is to occur, and shift determinations are not made at subsequent bit locations. The IF-THEN-ELSE chain may similarly continue though the bits until the leading one is found. Using such statements for FP32 numbers having 23 bits in a mantissa, conditions may be described as:

$$near(23) = !near(23) \text{ AND } near(22) = !near(23) \text{ AND } \\ !near(22) \text{ AND } near(21) = !near(23) \text{ AND } !near \\ (22) \text{ AND } !near(21) \text{ AND } !near(20) \text{ AND } !near \\ (19) \text{ AND } !near(18) \text{ AND } near(17) \quad \text{(Equation 1)},$$

where near(i) indicates how much to shift and to perform the shift, AND is a Boolean AND, and !near(i) indicates a complement of near(i). Using Equation 1, each condition may be recursively extracted out. For example, recursed conditions may include:

$$f\_a = !near(23) \text{ AND } !near(22) \text{ AND } !near(21) \text{ AND } \\ !near(20) \text{ AND } !near(19) \quad \text{(Equation 2)}$$

$$near(17) = f\_a \text{ AND } near(18) \quad \text{(Equation 3)}$$

$$near(16) = f\_a \text{ AND } !near(18) \text{ AND } near(17) \quad \text{(Equation 4)}$$

$$near(15) = f\_a \text{ AND } !near(18) \text{ AND } !near(17) \text{ AND } \\ near(16) \quad \text{(Equation 5)}.$$

Using these functions, each level in a shift may be handled with the same magnitude where every bit in the output may have a different complexity. Such equations may be implemented using OR and/or AND gates. However, these structures may be converted to faster logarithmic structures through logic restructuring using electronic design assistance tools to form circuitry within the combined circuit 302. The results of the logic restructuring may include:

$$y = x_{22} \& x_{21} | \overline{x_{22}} \& x_{21} \& x_{20} | \overline{x_{22}} \& \overline{x_{21}} \& x_{20} \& x_{19} | \ldots | \overline{x_{22}} \& \\ \overline{x_{21}} \& \overline{x_{20}} \& \ldots \& \overline{x_2} \& x_1 \& x_0 = (x_{22} \& x_{21} | \\ \overline{x_{22}} \& x_{21} \& x_{20} | \overline{x_{22}} \& \overline{x_{21}} \& x_{20} \& x_{19} | \ldots | \overline{x_{22}} \& \overline{x_{21}} \& \\ \overline{x_{20}} \& \ldots \& \overline{x_{13}} \& x_{12} \& x_{11}) | (\overline{x_{22}} \& \overline{x_{21}} \& \overline{x_{20}} \& \ldots \& \\ \overline{x_{12}}) \& (x_{11} \& x_{10} | \overline{x_{11}} \& x_{10} \& x_9 | \overline{x_{11}} \& \overline{x_{10}} \& x_9 \& \ldots \& \\ \overline{x_2} \& x_1 \& x_0)$$

Figure 11:
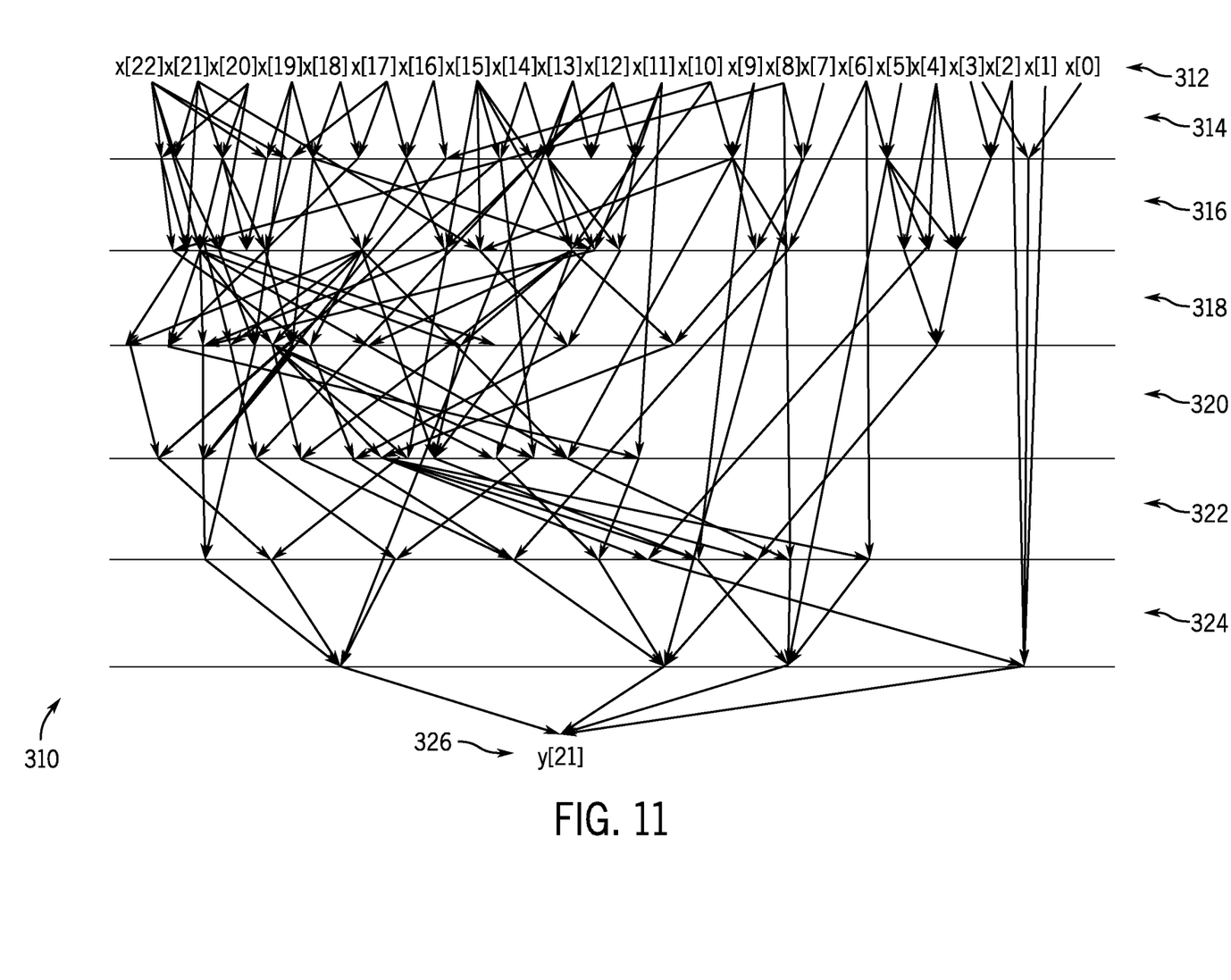
FIG. 11 is a logarithmic structure of the combined circuit of FIG. 10, in accordance with an embodiment of the disclosure.

FIG. 11 is an embodiment of a structure 310 that merges CLZ and normalization shifting may be implemented in the combined circuit 302 for a bit 21 in an FP32 adder after logic restructuring. As illustrated, the structure 310 receives input bits 312 and combines the input bits 312 in levels 314, 316, 318, 320, 322, and 324 as illustrated to generate an output 326 that includes CLZ and normalization shifting. The description of the structure may be manually recursed that may give different results during synthesis, especially when part of a large system. Furthermore, although the foregoing refers to FP32 with a 23-bit mantissa, similar techniques may be applied to other floating-point formats with different sizes of mantissas. Accordingly, using this combined circuit 302 may reduce the size of the CLZ 136 and the shifter 146 and increase efficiency over implementations having the separate CLZ 136 and shifter 136.

Furthermore, although the illustrated embodiment of the FP adder 300 includes the dual-path techniques with a shared adder/subtractor 132 and the combined circuit 302, some embodiments of floating-point operators may deploy the dual-path techniques used herein while other embodiments may deploy the combined circuit 302 without the dual-path techniques.

Figure 12:
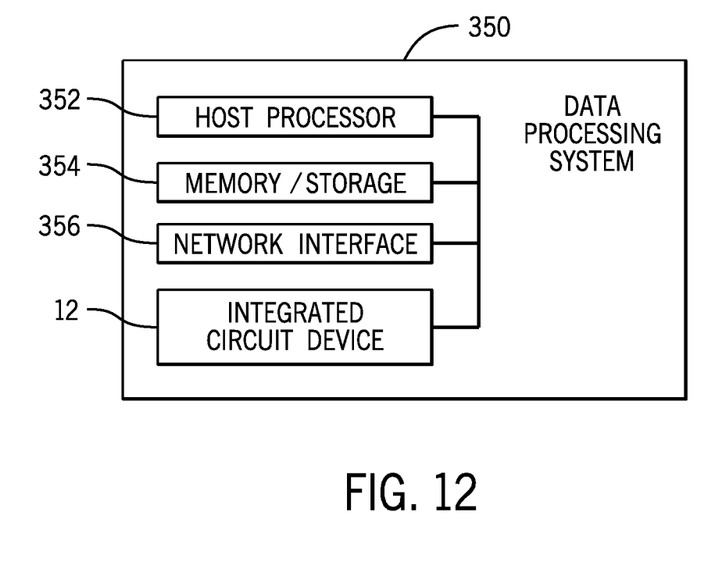
FIG. 12 is a diagram of a data processing system where one or more floating-point operators may be implemented, in accordance with an embodiment.

The integrated circuit device 12 may be, or may be a component of, a data processing system, such as the data processing system 350, shown in FIG. 12. The data processing system 350 may include a host processor 352, memory and/or storage circuitry 354, and a network interface 356. The data processing system 350 may include more or fewer components (e.g., electronic display, user interface structures, or ASICs). The host processor 352 may include any suitable processor, such as an INTEL® Xeon® processor or a reduced-instruction processor (e.g., a reduced instruction set computer (RISC), or an Advanced RISC Machine (ARM) processor) that may manage a data processing request for the data processing system 350 (e.g., to perform machine learning, video processing, voice recognition, image recognition, data compression, database search ranking, bioinformatics, network security pattern identification, spatial navigation, or the like). The memory and/or storage circuitry 354 may include random access memory (RAM), read-only memory (ROM), one or more hard drives, flash memory, or the like. The memory and/or storage circuitry 354 may hold data to be processed by the data processing system 350. In some cases, the memory and/or storage circuitry 304 may also store configuration programs (bitstreams) for programming the integrated circuit device 12. The network interface 356 may allow the data processing system 350 to communicate with other electronic devices. The data processing system 350 may include several different packages or may be contained within a single package on a single package substrate.

In one example, the data processing system 350 may be part of a data center that processes a variety of different requests. For instance, the data processing system 350 may receive a data processing request via the network interface 356 to perform machine learning, video processing, voice recognition, image recognition, data compression, database search ranking, bioinformatics, network security pattern identification, spatial navigation, or some other specialized task. The host processor 352 may cause the programmable logic fabric of the integrated circuit device 12 to be programmed with a multiplier suitable to implement a requested task. For instance, the host processor 352 may instruct that a configuration data (bitstream) stored on the memory and/or storage circuitry 354 to be programmed into the programmable logic fabric of the integrated circuit device 12. The configuration data (bitstream) may represent a circuit design for a set of one or more floating point multipliers, which may be mapped to and packed together in the programmable logic according to the techniques described herein.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended example embodiments.

EXAMPLE EMBODIMENTS OF THE DISCLOSURE

The following numbered clauses define certain example embodiments of the present disclosure.

EXAMPLE EMBODIMENT 1. A system comprising:
floating-point arithmetic circuitry that receives two floating-point numbers, wherein the floating-point arithmetic circuitry comprises:
a first path that performs a first operation on the two floating-point numbers based at least in part on a difference in size between the two floating-point numbers; and
a second path that performs a second operation on the two floating-point numbers based at least in part on the difference in size between the two floating-point numbers, wherein the first path and the second path diverge from each other to converge on a shared adder that is used for the first operation and the second operation before the first and second paths diverge again.

EXAMPLE EMBODIMENT 2. The system of example embodiment 1, comprising a comparator that determines an exponent difference between exponents of the two floating-point numbers, wherein the first path performs the second operation on the two floating-point numbers when the difference is less than a threshold.

EXAMPLE EMBODIMENT 3. The system of example embodiment 2, wherein the first operation comprises a subtraction when the difference is greater than or equal to the threshold.

EXAMPLE EMBODIMENT 4. The system of example embodiment 2, wherein the first operation comprises an addition when the difference is greater than or equal to the threshold.

EXAMPLE EMBODIMENT 5. The system of example embodiment 2, wherein the first operation comprises an addition when the difference is less than the threshold.

EXAMPLE EMBODIMENT 6. The system of example embodiment 2, wherein the second operation comprises a subtraction when the difference is less than the threshold.

EXAMPLE EMBODIMENT 7. The system of example embodiment 2, wherein the threshold comprises two.

EXAMPLE EMBODIMENT 8. The system of example embodiment 1 comprising a multiplexer that selects between transmitting a first shifted mantissa from the first path to the shared adder and transmitting a second shifted mantissa from the second path to the shared adder.

EXAMPLE EMBODIMENT 9. The system of example embodiment 8, wherein the first path comprises a multi-bit shifter that generates the first shifted mantissa.

EXAMPLE EMBODIMENT 10. The system of example embodiment 8, wherein the second path comprises a single-bit shifter that generates the second shifted mantissa.

EXAMPLE EMBODIMENT 11. The system of example embodiment 1, wherein the second path comprises:
count leading zeros circuitry that receive a result from the shared adder and count a number of leading zeros in the result; and
a normalization shifter that shift the result to generate a normalized output based at least in part on the number of leading zeros.

EXAMPLE EMBODIMENT 12. The system of example embodiment 1, wherein the second path comprises a combination circuit that performs a shift detection and apply a shift by combining input bits from a result from the shared adder using a plurality of levels combining the input bits according to a logarithmic structure.

EXAMPLE EMBODIMENT 13. The system of example embodiment 1, wherein the first path comprises round and add circuitry that receives a result from the shared adder and to round the result.

EXAMPLE EMBODIMENT 14. The system of example embodiment 13, wherein the round and add circuitry comprises:
a parallel prefix circuit that receives the result;
a multiplexer that controls rounding at a rounding bit of the parallel prefix circuit;
an OR gate that drives a propagate bit of the parallel prefix circuit high based on a location of the rounding bit; and
an output multiplexer that shifts an output of the parallel prefix circuit left or right by one bit.

EXAMPLE EMBODIMENT 15. A method comprising:
receiving a first floating-point number;
receiving a second floating-point number;
splitting a first mantissa of the first floating-point number into a first path and a second path;
shifting the first mantissa in a first shifter in the first path to generate a first shifted mantissa;
shifting the first mantissa in a second shifter in the second path to generate a second shifted mantissa, wherein the first shifter is larger than the second shifter;
selecting a selected mantissa from the first shifted mantissa and the second shifted mantissa;
adding the selected mantissa to or subtracting the selected mantissa from a second mantissa of the second floating-point number in an adder/subtractor;
transmitting a result from the adder/subtractor into a third path and a fourth path; and
selecting an output between the third path and the fourth path.

EXAMPLE EMBODIMENT 16. The method of example embodiment 15, wherein the first floating-point number has a smaller exponent than the second floating-point number.

EXAMPLE EMBODIMENT 17. The method of example embodiment 15 comprising determining how far to shift for normalization and normalizing the result in the third path.

EXAMPLE EMBODIMENT 18. The method of example embodiment 15 comprising rounding the result in rounding circuitry in the fourth path, wherein the rounding circuitry comprises a single-bit shift configured to normalize the result after rounding the result.

EXAMPLE EMBODIMENT 19. A system comprising:
a first input configured to receive a first mantissa for a first floating-point number;
a second input configured to receive a second mantissa for a second floating-point number;
a first path having a first shifter configured to shift the first mantissa as a first shifted mantissa;
a second path having a second shifter configured to shift the first mantissa as a second shifted mantissa, wherein the second shifter is smaller than the first shifter, and the second shifter comprises a single-bit shifter;
a multiplexer configured to select between the first shifted mantissa and the second shifted mantissa and output a selected mantissa;
an adder/subtractor configured to receive the selected mantissa from the adder/subtractor;
a third path configured to determine how far to shift a result from the adder/subtractor based on values of bits in the result and to perform the shift;
a fourth path configured to round the result from the adder/subtractor; and
an output multiplexer configured to select an output for the system from the result in the third path and the result in the fourth path.

EXAMPLE EMBODIMENT 20. The system of example embodiment 19, wherein the third path comprises a combined circuit configured to perform the shift and determination using a logic tree structure configured to combine inputs in the result in a plurality of levels to generate output bits.

What is claimed is:

1. A system comprising:
   floating-point arithmetic circuitry that receives two floating-point numbers, wherein the floating-point arithmetic circuitry comprises:
   a first path that performs a first operation on the two floating-point numbers based at least in part on a difference in size between the two floating-point numbers; and
   a second path that performs a second operation on the two floating-point numbers based at least in part on the difference in size between the two floating-point numbers, wherein the first path and the second path diverge from each other to converge on a shared adder that is used for the first operation and the second operation before the first and second paths diverge again; and
   a multiplexer that selects between transmitting a first shifted mantissa from the first path to the shared adder and transmitting a second shifted mantissa from the second path to the shared adder.

2. The system of claim 1, comprising a comparator that determines an exponent difference between exponents of the two floating-point numbers, wherein the first path performs the second operation on the two floating-point numbers when the exponent difference is less than a threshold.

3. The system of claim 2, wherein the first operation comprises a subtraction when the exponent difference is greater than or equal to the threshold.

4. The system of claim 2, wherein the first operation comprises an addition when the exponent difference is greater than or equal to the threshold.

5. The system of claim 2, wherein the first operation comprises an addition when the exponent difference is less than the threshold.

6. The system of claim 2, wherein the second operation comprises a subtraction when the exponent difference is less than the threshold.

7. The system of claim 2, wherein the threshold comprises two.

8. The system of claim 1, wherein the first path comprises a multi-bit shifter that generates the first shifted mantissa.

9. The system of claim 1, wherein the second path comprises a single-bit shifter that generates the second shifted mantissa.

10. The system of claim 1, wherein the second path comprises:
    count leading zeros circuitry that receive a result from the shared adder and count a number of leading zeros in the result; and
    a normalization shifter that shift the result to generate a normalized output based at least in part on the number of leading zeros.

11. The system of claim 1, wherein the second path comprises a combination circuit that performs a shift detection and applies a shift by combining input bits from a result from the shared adder using a plurality of levels combining the input bits according to a logarithmic structure.

12. The system of claim 1, wherein the first path comprises round and add circuitry that receives a result from the shared adder and to round the result.

13. The system of claim 12, wherein the round and add circuitry comprises:
    a parallel prefix circuit that receives the result;
    a multiplexer that controls rounding at a rounding bit of the parallel prefix circuit;
    an OR gate that drives a propagate bit of the parallel prefix circuit high based on a location of the rounding bit; and
    an output multiplexer that shifts an output of the parallel prefix circuit left or right by one bit.

14. A method comprising:
    receiving a first floating-point number;
    receiving a second floating-point number;
    splitting a first mantissa of the first floating-point number into a first path and a second path;
    shifting the first mantissa in a first shifter in the first path to generate a first shifted mantissa;
    shifting the first mantissa in a second shifter in the second path to generate a second shifted mantissa, wherein the first shifter is larger than the second shifter;
    selecting a selected mantissa from the first shifted mantissa and the second shifted mantissa;
    adding the selected mantissa to or subtracting the selected mantissa from a second mantissa of the second floating-point number in an adder/subtractor;
    transmitting a result from the adder/subtractor into a third path and a fourth path; and
    selecting an output between the third path and the fourth path.

15. The method of claim 14, wherein the first floating-point number has a smaller exponent than the second floating-point number.

16. The method of claim 14 comprising determining how far to shift for normalization and normalizing the result in the third path.

17. The method of claim 14 comprising rounding the result in rounding circuitry in the fourth path, wherein the rounding circuitry comprises a single-bit shift configured to normalize the result after rounding the result.

18. A system comprising:
    a first input configured to receive a first mantissa for a first floating-point number;
    a second input configured to receive a second mantissa for a second floating-point number;
    a first path having a first shifter configured to shift the first mantissa as a first shifted mantissa;
    a second path having a second shifter configured to shift the first mantissa as a second shifted mantissa, wherein the second shifter is smaller than the first shifter, and the second shifter comprises a single-bit shifter;
    a multiplexer configured to select between the first shifted mantissa and the second shifted mantissa and output a selected mantissa;
    an adder/subtractor configured to receive the selected mantissa from the adder/subtractor;
    a third path configured to determine how far to shift a result from the adder/subtractor based on values of bits in the result and to perform the shift;
    a fourth path configured to round the result from the adder/subtractor; and
    an output multiplexer configured to select an output for the system from the result in the third path and the result in the fourth path.

19. The system of claim 18, wherein the third path comprises a combined circuit configured to perform the shift and determination using a logic tree structure configured to combine inputs in the result in a plurality of levels to generate output bits.

* * * * *